United States Patent
Jung

(10) Patent No.: US 11,327,603 B2
(45) Date of Patent: May 10, 2022

(54) MULTI-REGION MOTION SENSOR FOR MOTION FEEDBACK INTERFACE AND METHOD OF OPERATING THE SAME

(71) Applicant: DAMOATECH CO., LTD., Seongnam-si (KR)

(72) Inventor: Hu Min Jung, Hanam-si (KR)

(73) Assignee: DAMOATECH CO, LTD., Seongnam-si (KR)

( * ) Notice: Subject to any disclaimer, the term of this patent is extended or adjusted under 35 U.S.C. 154(b) by 0 days.

(21) Appl. No.: 17/389,676

(22) Filed: Jul. 30, 2021

(65) Prior Publication Data
US 2022/0035475 A1    Feb. 3, 2022

(30) Foreign Application Priority Data
Jul. 31, 2020   (KR) .................. 10-2020-0096399

(51) Int. Cl.
| | | |
|---|---|---|
| *G06F 3/041* | (2006.01) | |
| *G06F 3/044* | (2006.01) | |
| *H03K 17/955* | (2006.01) | |
| *H03K 17/96* | (2006.01) | |

(52) U.S. Cl.
CPC ............ *G06F 3/0418* (2013.01); *G06F 3/044* (2013.01); *G06F 2203/04108* (2013.01); *H03K 17/955* (2013.01); *H03K 17/962* (2013.01)

(58) Field of Classification Search
None
See application file for complete search history.

(56) References Cited

U.S. PATENT DOCUMENTS

| | | |
|---|---|---|
| 8,692,565 B2 | 4/2014 | Togura |
| 8,823,399 B1 | 9/2014 | Bharathan |
| 10,755,674 B2 | 8/2020 | Wengelnik et al. |
| 2015/0091856 A1* | 4/2015 | Park .................... G06F 3/04182 345/174 |
| 2018/0164886 A1 | 6/2018 | Khoshkava et al. |

FOREIGN PATENT DOCUMENTS

| | | |
|---|---|---|
| KR | 2010-0070964 A | 6/2010 |
| KR | 2010-0100773 A | 9/2010 |
| KR | 2018-0068303 A | 6/2018 |
| KR | 2019-0087339 A | 7/2019 |
| KR | 102020311 B1 | 9/2019 |
| KR | 102111926 B1 | 5/2020 |
| KR | 102124410 B1 | 6/2020 |

* cited by examiner

*Primary Examiner* — Stephen T. Reed
(74) *Attorney, Agent, or Firm* — United One Law Group LLC; Kongsik Kim; Jhongwoo Peck

(57) ABSTRACT

Disclosed are a single-channel multi-region motion sensor and a method of operating the same. The single-channel multi-region motion includes: a first resonant circuit; at least one first electrode electrically connected to the first resonant circuit; a second resonant circuit; at least one second electrode electrically connected to the second resonant circuit; and a detection circuit configured to receive a first electric signal formed on the first resonant circuit and the at least one first electrode and a second electric signal formed on the second resonant circuit and the at least one second electrode. The detection circuit detects a difference between the first resonant frequency of the first electric signal and the second resonant frequency of the second electric signal, and detects the proximity of a conductor or the location of a touch attributable to a user motion.

16 Claims, 6 Drawing Sheets

MULTI-REGION MOTION SENSOR FOR MOTION FEEDBACK INTERFACE AND METHOD OF OPERATING THE SAME

CROSS-REFERENCE TO RELATED APPLICATION

This application claims under 35 U.S.C. § 119(a) the benefit of priority to Korean Patent Application No. 10-2020-0096399 filed on Jul. 31, 2020, which is incorporated herein by reference in its entirety.

TECHNICAL FIELD

The present invention relates to a proximity-based user interface device, a sensor for the device, and a method of operating the same. More specifically, the present invention relates to a technology for providing a proximity-based motion feedback interface, in which the motion feedback is a technology that provides the results of gesture recognition and motion recognition via various senses including sight, touch, and/or hearing.

BACKGROUND ART

In recent years, touch recognition technology has made rapid development, and many up-to-date devices include various touch-sensitive input devices in order to allow users to interact with the former devices. The touch sensing technology can detect not only a direct touch but also whether a human body has come close to a sensor.

As an example of a technology for providing user feedback based on touch or proximity sensing technology, Korean Patent Application Publication No. 10-2018-0068303 discloses "Systems and Methods for Proximity-based Haptic Feedback." The technology disclosed in this related art document is configured to detect a contact or non-contact proximity interaction and transmit it to a haptic output device.

As an example of a feedback technology that supports a user so that the user can operate a user display based on a touch or proximity sensing technology in a special environment such as a car, Korean Patent No. 10-2124410 discloses an "Apparatus, Transport Means, and Method for Supporting a User upon Operating a Touch Sensitive Display Device." This related art document discloses a technology for detecting a user's proximity and the location of the proximity and then switching a display device between a display mode and an operation mode.

Korean Patent No. 10-2020311 entitled "Gesture Recognition Method Using Multi-Channel Electrode Proximity Sensor and Terminal thereof" discloses a gesture recognition technology using a multi-channel electrode proximity sensor in a mobile device. The mobile device can recognize the location of a user's proximity and the movement of a user's proximity/touch by using the multi-channel electrode proximity sensor, so that user gestures are recognized based on this capability.

The technologies disclosed in these related art documents mainly recognize a user gesture by detecting whether a part of a user's body or a conductor comes close to or comes into contact with a device or detecting proximity/the movement of the location of proximity by means of a capacitive touch or proximity sensor.

In the technologies disclosed in these related art documents, to recognize a user gesture for a plurality of locations, separate sensors are used for the respective locations or respective regions, or individual channels are allocated to the respective locations. As the number of divided regions increases, the number of sensors or channels increases, and thus the cost increases.

Korean Patent No. 10-2111926 entitled "Detecting and Differentiating Touches from Conductive Objects of Different Sizes on Capacitive Buttons" discloses a technology that determines whether a conductor that has come close within an individually allocated capacitive button is a human finger or a stylus based on the size thereof. In the technology disclosed in this related art document, a first electrode and a second electrode are implemented as separate channels in each button, and the first capacitance of the first electrode and the second capacitance of the second electrode are measured separately. Accordingly, this technology is problematic in that it incurs increased costs compared to the case where one channel is allocated for each button.

According to the technologies disclosed in the related art documents, individual channels are allocated for respective detection targets (the location of proximity/touch, the size of a proximity/touch object, etc.), and thus they have a common problem in which the cost increases as detection accuracy increases.

SUMMARY

Although the above-described related arts provide a touch/proximity sensing-based technology for detecting a user motion for various applications, they are problematic in that the number of required channels increases as detection targets (the location of touch/proximity, and the size or type of touch/proximity) are subdivided, and thus the cost increases. At least one sensor integrated circuit (IC) is required for one channel, which increases the cost.

An object of the present invention is to provide a technology capable of detecting the location of a user's touch/proximity and also tracking the movement of the location of touch/proximity over time through a motion sensor configuration using a single channel, thereby accurately detecting the input of a user motion to a device through a single channel.

An object of the present invention is to identify proximity to each of all regions around a device using a single-channel sensor, thereby reducing hardware costs.

An object of the present invention is to detect proximity to individual locational regions through a single measurement without a frequency component scan, thereby reducing power consumption and shortening detection time.

An object of the present invention is to provide a user interface capable of detecting changes in a time domain and recognizing gestures using a single-channel motion sensor.

According to an aspect of the present invention, there is provided a single-channel multi-region motion sensor including: a first resonant circuit; at least one first electrode electrically connected to the first resonant circuit; a second resonant circuit; at least one second electrode electrically connected to the second resonant circuit; and a detection circuit configured to receive a first electric signal formed on the first resonant circuit and the at least one first electrode and a second electric signal formed on the second resonant circuit and the at least one second electrode. The detection circuit is further configured to detect a difference between the first resonant frequency of the first electric signal and the second resonant frequency of the second electric signal, and to detect the proximity of a conductor or the location of a touch attributable to a user motion in accordance with the location of the at least one first electrode and the location of the at least one second electrode based on the polarity and magnitude of the value of the difference between the first resonant frequency and the second resonant frequency.

The at least one first electrode may include a plurality of first locational region electrode elements that are all electrically connected to each other. The detection circuit may be further configured to detect the proximity of the conductor or the location of the touch attributable to the user motion in accordance with the locations of the plurality of first locational region electrode elements based on the polarity and magnitude of the value of the difference between the first resonant frequency and the second resonant frequency.

The plurality of first locational region electrode elements may be disposed to correspond to different first individual locational regions, respectively, around the motion sensor. The plurality of first locational region electrode elements may be formed to have different sizes or different shapes.

The plurality of first locational region electrode elements and the first individual locational regions may correspond to respective predetermined different per-individual locational region detected value ranges. The detection circuit may be further configured to detect the proximity of the conductor or the location of the touch attributable to the user motion by determining one of the per-individual locational region detected value ranges within which the magnitude of the value of the difference between the first resonant frequency and the second resonant frequency falls.

The detection circuit may be further configured to determine the user motion to be an invalid user motion when the magnitude of the value of the difference between the first resonant frequency and the second resonant frequency is out of the per-individual locational region detected value ranges.

The detection circuit may be further configured to detect the polarities and magnitudes of the values of the difference between the first resonant frequency and the second resonant frequency over time, and to generate detected values over time. The detection circuit may be further configured to track the movement of the proximity of the conductor or the movement of the location of the touch attributable to the user motion based on the detected values over time.

The detection circuit may be further configured to detect the polarity and magnitude of the value of the difference between the first resonant frequency and the second resonant frequency through a single measurement, and to generate detected values.

The detection circuit may include: an operator configured to calculate a difference between a first resonant frequency and a second resonant frequency; a low-pass filter connected to the output terminal of the calculator, and configured to eliminate high-frequency components; and an output signal generator connected to the output terminal of the low-pass filter, and configured to generate an electric signal proportional to quantitative information corresponding to the difference between the first resonant frequency and the second resonant frequency.

According to another aspect of the present invention, there is provided a motion feedback interface device including: a single-channel multi-region motion sensor; and a controller; wherein the single-channel multi-region motion sensor includes: a first resonant circuit; at least one first electrode electrically connected to the first resonant circuit; a second resonant circuit; at least one second electrode electrically connected to the second resonant circuit; and a detection circuit configured to receive a first electric signal formed on the first resonant circuit and the at least one first electrode and a second electric signal formed on the second resonant circuit and the at least one second electrode.

The detection circuit is further configured to detect a difference between the first resonant frequency of the first electric signal and the second resonant frequency of the second electric signal, and to detect the proximity of a conductor or the location of a touch attributable to a user motion in accordance with the location of the at least one first electrode and the location of the at least one second electrode based on the polarity and magnitude of the value of the difference between the first resonant frequency and the second resonant frequency. The controller determines a user input, intended by the user motion, based on the proximity of the conductor or the location of the touch attributable to the user motion.

The at least one first electrode may include a plurality of first locational region electrode elements that are all electrically connected to each other. The plurality of first locational region electrode elements may be disposed to correspond to different first individual locational regions, respectively, around the motion sensor. The detection circuit may be further configured to detect the proximity of the conductor or the location of the touch attributable to the user motion in accordance with the first individual locational regions based on the polarity and magnitude of the value of the difference between the first resonant frequency and the second resonant frequency.

The detection circuit may be further configured to detect the polarities and magnitudes of the values of the difference between the first resonant frequency and the second resonant frequency over time, and to generate detected values over time. The detection circuit may be further configured to track the movement of the proximity of the conductor or the movement of the location of the touch attributable to the user motion based on the detected values over time. The controller may translate the movement of the proximity of the conductor or the movement of the location of the touch attributable to the user motion as a user input intended by the user motion.

According to still another aspect of the present invention, there is provided a method of operating a single-channel multi-region motion sensor including a detection circuit and a controller, the method including: receiving, by the detection circuit, a first electric signal formed on a first resonant circuit and at least one first electrode electrically connected to the first resonant circuit; receiving, by the detection circuit, a second electric signal formed on a second resonant circuit and at least one second electrode electrically connected to the second resonant circuit; detecting, by the detection circuit, a difference between the first resonant frequency of the first electric signal and the second resonant frequency of the second electric signal; and detecting, by the detection circuit, the proximity of a conductor or the location of a touch attributable to a user motion in accordance with the location of the at least one first electrode and the location of the at least one second electrode based on the polarity and magnitude of the value of the difference between the first resonant frequency and the second resonant frequency.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
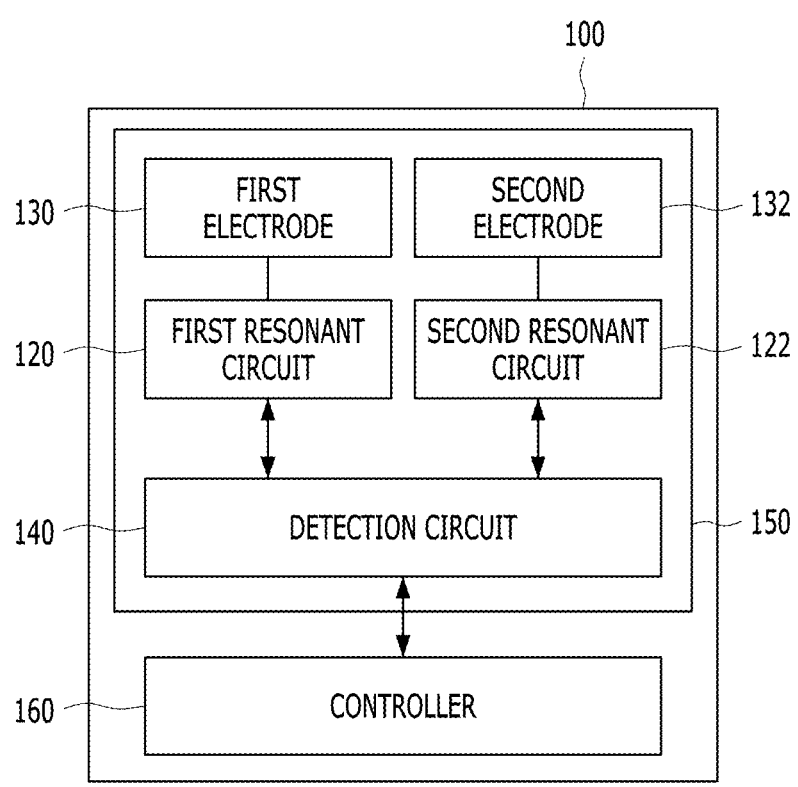
FIG. 1 is a conceptual block diagram showing a motion feedback interface device and a single-channel multi-region motion sensor according to an embodiment of the present invention.

Other objects and features of the present invention in addition to the above objects will be apparent from the following description of embodiments given with reference to the accompanying drawings. Embodiments of the present invention will be described in detail below with reference to the accompanying drawings. In the following description, when it is determined that a detailed description of a related known component or function may unnecessarily make the gist of the present invention obscure, it will be omitted.

Korean Patent Application Publication No. 10-2018-0068303 entitled "Systems and Methods for Proximity-based Haptic Feedback," Korean Patent No. 10-2124410 entitled "Apparatus, Transport Means, and Method for Supporting a User upon Operating a Touch Sensitive Display Device," Korean Patent No. 10-2020311 entitled "Gesture Recognition Method Using Multi-Channel Electrode Proximity Sensor and Terminal thereof," and Korean Patent No. 10-2111926 entitled "Detecting and Differentiating Touches from Conductive Objects of Different Sizes on Capacitive Buttons" disclose technologies related to the present invention. The technologies disclosed in the related art documents are partially related to the objects of the present invention, and some of the solutions employed by the present invention may be borrowed from the related technologies.

Only the items commonly included to embody the present invention among the items disclosed in the related art documents will be considered to be parts of the configuration of the present invention. In addition, detailed descriptions of the items obvious to those skilled in the art through the related art documents among the items necessary for embodying the present invention may be omitted in this specification.

Korean Patent Application Publication No. 10-2018-0068303 entitled "Systems and Methods for Proximity-based Haptic Feedback," Korean Patent No. 10-2124410 entitled "Apparatus, Transport Means, and Method for Supporting a User upon Operating a Touch Sensitive Display Device," and Korean Patent No. 10-2020311 entitled "Gesture Recognition Method Using Multi-Channel Electrode Proximity Sensor and Terminal thereof" disclose various applications for a user interface using motion sensing technology obtained based on the configuration of the present invention. Detailed descriptions of these applications will be omitted in this specification. However, although the technologies disclosed in the related art documents propose haptic feedback or a user interface for smartphones, the configuration of the present invention may be applied to various applications that provide the translation of user input using touch or proximity-based user motion sensing information, and visual, auditory, olfactory, tactile, gustatory, or synesthetic feedback presented in response to the user input.

A single-channel multi-region motion sensor, a motion feedback interface device, and a method of operating the same according to embodiments of the present invention will be described in detail below with reference to FIGS. 1 to 6.

FIG. 1 is a conceptual block diagram showing a motion feedback interface device 100 and a single-channel multi-region motion sensor 150 according to an embodiment of the present invention.

The motion feedback interface device 100 includes the single-channel multi-region motion sensor 150 and a controller 160. The single-channel multi-region motion sensor 150 includes: a first resonant circuit 120; at least one first electrode 130 electrically connected to the first resonant circuit 120; a second resonant circuit 122; at least one second electrode 122 electrically connected to the second resonant circuit 122; and a detection circuit 140 configured to receive a first electric signal formed on the first resonant circuit 120 and the at least one first electrode 130 and a second electric signal formed on the second resonant circuit 122 and the at least one second electrode 132. The detection circuit 140 detects a difference between the first resonant frequency ω1 of the first electric signal and the second resonant frequency ω2 of the second electric signal, and detects the proximity of a conductor or the location of a touch attributable to a user motion in accordance with the location of the at least one first electrode 130 and the location of the at least one second electrode 132 based on the polarity and magnitude of the value of the difference between the first resonant frequency and the second resonant frequency.

The configuration of FIG. 1 and the configurations of the related art documents may be included as parts of the configuration of the present invention, and the unique effects of the present invention will be achieved in combination with the novel configurations of the present invention to be described later. In particular, recently, in combination with a mobile device, a smart device, virtual reality, augmented reality, and/or the like, a user interface aims to accurately recognize precise touch/proximity-based user motions and gestures and understand a user's intentions. The present invention proposes a technology that determines a user's intentions and accurately recognizes a user's gestures by precisely measuring and quantifying user motions around the user motion feedback interface device 100 through conventional capacitive sensing.

Figure 2:
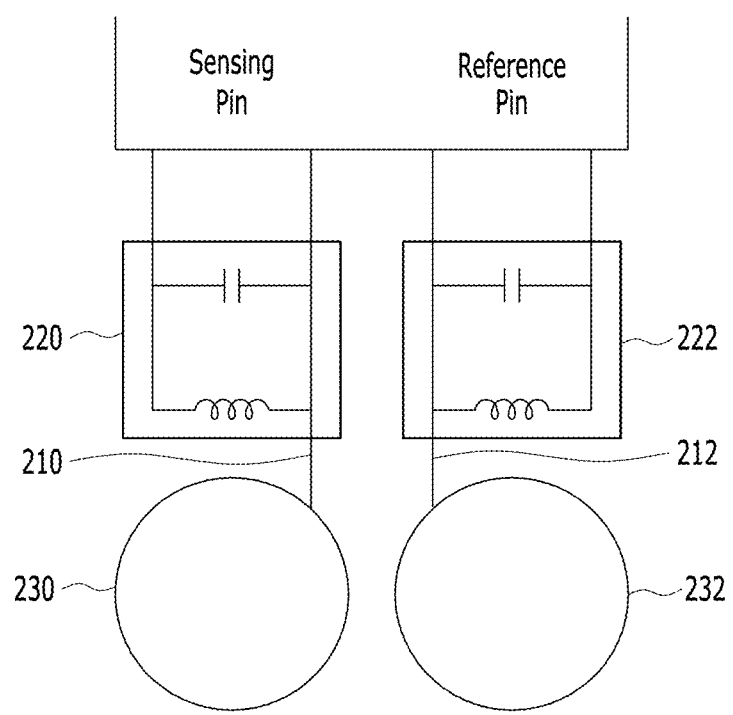
FIG. 2 is a diagram showing a single-channel multi-region motion sensor according to an embodiment of the present invention.

FIG. 2 is a diagram showing a single-channel multi-region motion sensor 150 according to an embodiment of the present invention.

Referring to FIG. 2, a detection circuit 140 receives a first electric signal, formed in a first resonant circuit 220 and a first electrode 230, through a first port 210. In the same manner, the detection circuit 140 receives a second electric signal, formed in a second resonant circuit 222 and a second electrode 232, through a second port 212.

The first resonant circuit 220 and the second resonant circuit 222 may be designed such that a first resonant frequency and a second resonant frequency are maintained in the same states in the absence of an external input. Alternatively, a difference between the first resonant frequency and the second resonant frequency in the absence of an external input may be pre-measured as an offset, and a measured value may be compensated for by using the offset when a user input is sensed.

When a conductor such as a user's finger or a stylus used by the user comes close to the first electrode 230 or the second electrode 232 or touches the first electrode 230 or the second electrode 232, this may change a difference between the first resonant frequency and the second resonant frequency. For example, when the user's conductor comes close to only the first electrode 230 and does not come close to the second electrode 232, the capacitance formed by the first electrode 230 together with the conductor affects the L and C values of the first resonant circuit 220, so that the first resonant frequency of the first electric signal formed on the first resonant circuit 220 is changed. Assuming that the first resonant frequency is increased due to the proximity of the conductor, a difference between the first resonant frequency and the second resonant frequency will appear as a value with a positive sign (+). The detection circuit 140 may detect such a difference, and may determine that a significant user input has been made when detecting a difference in the resonant frequency that exceeds a minimum threshold.

In contrast, assuming that when the user's conductor comes close to only the second electrode 232 and does not come close to the first electrode 230, the second resonant frequency is increased, a difference between the first resonant frequency and the second resonant frequency will appear as a value with a negative sign (−).

Accordingly, the detection circuit 140 may detect a difference between the resonant frequencies of the two electric resonant signals of the sensor forming a single channel, and may determine whether the user's conductor has come close to the first electrode 230 or the second electrode 232. In other words, the detection circuit 140 may detect the proximity of the conductor or the location of a touch attributable to a user motion based on the difference between the resonant frequencies.

When the user motion feedback interface device 100 is implemented such that a user selects any one of a first button and a second button, it may be determined whether the user has intended to select either the first button or the second button through a configuration such as that shown in FIG. 2. Furthermore, a valid resonant frequency change range, i.e., a valid range of the measured values of differences in resonant frequency, that is allowed in the case where the user selects either the first button or the second button may be set. In this case, a measured value may be considered to be a valid user input when the measured value falling within the corresponding range appears, and a measured value may be considered to be a change in resonant frequency attributable to a motion unintended by the user when the measured value out of the corresponding range appears.

Figure 3:
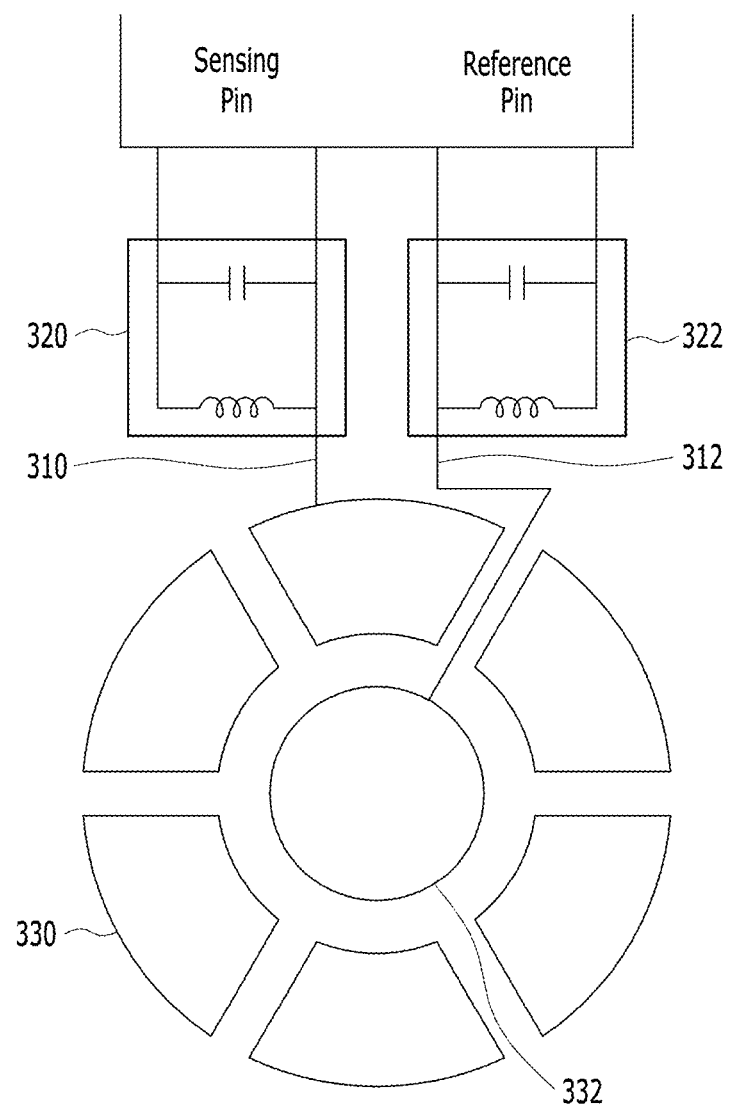
FIG. 3 is a diagram showing a single-channel multi-region motion sensor according to an embodiment of the present invention.

FIG. 3 is a diagram showing a single-channel multi-region motion sensor 150 according to an embodiment of the present invention.

Referring to FIG. 3, the configurations of a first port 310, a first resonant circuit 320, a second port 312, and a second resonant circuit 322 are the same as those of FIG. 2, and thus redundant descriptions thereof will be omitted.

In FIG. 3, a first electrode 330 may be divided into a plurality of first locational region electrode elements. A second electrode 332 may be disposed in a circular form at the center of an electrode unit.

Although detailed illustration is omitted in FIG. 3, the plurality of first locational region electrode elements of the first electrode 330 is all electrically connected to each other.

The plurality of first locational region electrode elements corresponds to respective locational regions outside the second electrode 332.

Although detailed illustration is omitted in FIG. 3, the plurality of first locational region electrode elements may all have different sizes or different shapes. This makes it possible to detect the proximity of a conductor or the location of a touch attributable to a user motion due to the differentiated topology of each of the first locational region electrode elements.

A user motion feedback interface device 100 using the embodiment of FIG. 3 may be an interface having a circular individual locational area divided into central and six outer side regions. The interface device 100 may have a hemispherical outward shape, or may be implemented in the form of a circular panel. Alternatively, it may be implemented in the form of a circular handle.

A case in which a user swipes the device 100 from the center to the outside and a case in which the user swipes the device 100 from the outside to the center may be recognized as different user motions in the embodiment of FIG. 3. Furthermore, since the individual locational regions on the outer side shown in FIG. 3 provide different frequency shifts, a locational region toward which the swiping of a user motion is directed or a location region from which the swiping of a user motion starts may be determined. It will be apparent that even when the user swipes from any one locational region on the outer side to another locational region on the outer side, a location at which the user motion starts and a location at which the user motion ends may be distinguished from each other and detected separately in the embodiment of FIG. 3.

In connection with the embodiment of FIG. 3, in an application in which it is not important whether there is actually user proximity to the central portion, the embodiment of FIG. 3 may be modified into a state in which the second port 312 and the central second electrode 332 are not connected to each other. In this case, the second resonant circuit 322 may function as a reference resonant circuit for the first resonant circuit 320. The reference resonant circuit refers to a resonant circuit that is not affected by the outside and maintains an initial resonant frequency without change.

Figure 4:
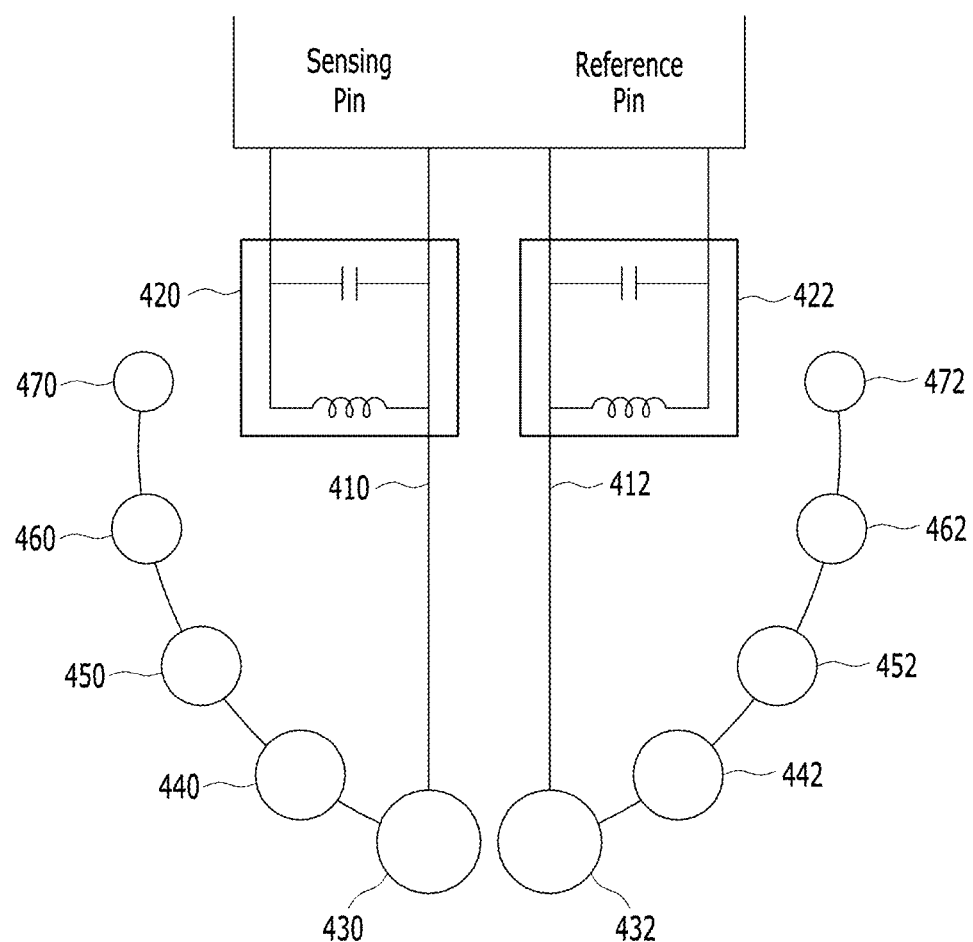
FIG. 4 is a diagram showing a single-channel multi-region motion sensor according to an embodiment of the present invention.

FIG. 4 is a diagram showing a single-channel multi-region motion sensor 150 according to an embodiment of the present invention.

Referring to FIG. 4, the configurations of a first port 410, a first resonant circuit 420, a second port 412, and a second resonant circuit 422 are the same as those of FIG. 2, and thus redundant descriptions thereof will be omitted.

A first electrode may include a plurality of first locational region electrode elements 430, 440, 450, 460, and 470 that corresponds to respective locational regions. A second electrode may also include a plurality of second locational region electrode elements 432, 442, 452, 462, and 472 that corresponds to respective locational regions.

For ease of description, the first locational region electrode elements and the second locational region electrode elements may be implemented to have symmetry in order to correspond to each other. For example, each of the electrode elements 430 and a corresponding one of the electrode elements 432 may have the same shape and size and be disposed at locations symmetrical with respect to a central reference line (a virtual reference line).

The sizes of electrode elements implementing one electrical connection are different. For example, the first locational region electrode elements 430, 440, 450, 460, and 470 may all have different sizes. Furthermore, in FIG. 4, there is shown a semicircular arrangement for different individual locational regions on the outer side of the motion sensor 150.

In an embodiment, more electrode elements may be arranged such that the individual locational regions that can be covered form a circle.

According to the area or shape of each of the electrode elements, a pattern of capacitance formed when a conductor attributable to a user motion comes close to the electrode element may appear differently. In other words, in the embodiment of FIG. 4, when a conductor comes close to the electrode element 430 or the electrode element 432, a change in capacitance may be largest, and a change in resonant frequency may also be largest.

In contrast, when the conductor comes close to the electrode element 470 or the electrode element 472, a change in capacitance may be smallest, and a change in resonant frequency may also be smallest. By combining these, it may be possible to identify an electrode element to which a conductor attributable to a user motion has come close based on the polarity and magnitude of a difference in resonant frequency detected by the detection circuit 140.

Each of the electrode elements may be expected to have the sign and range of the detected values of changes in resonant frequency based on a predetermined size and shape. A detected value range for each individual locational region may be predetermined in correspondence with an expected sign and range.

The detected value ranges for respective individual locational regions may be set not to overlap each other, and thus the sizes and shapes of the respective electrode elements may be determined accordingly. The detection circuit 140 detects the proximity of a conductor or the location of a touch attributable to a user motion by determining one of the detected value ranges for the respective individual locational regions within which the value of a difference between the first resonant frequency and the second resonant frequency falls.

The detection circuit 140 may determine a user motion in question to be an invalid user motion when the value of a difference between the first resonant frequency and the second resonant frequency is out of the detected value ranges for the respective individual locational regions.

The detection circuit 140 may generate detected values over time by detecting the polarities and magnitudes of the values of the difference between the first resonant frequency and the second resonant frequency over time. The detection circuit 140 may track the movement of the proximity of a conductor or the movement of the location of a touch attributable to a user motion based on the values detected over time.

The detection circuit 140 may generate a detected value by detecting the polarity and magnitude of the difference between the first resonant frequency and the second resonant frequency through a single measurement without a frequency scan or change.

The configuration of the present invention detects a change in capacitance between the electrode elements and a conductor attributable to the proximity of the conductor and a natural change in the resonant frequency of the resonant circuit attributable to the change in capacitance. Accordingly, it is not necessary to change the resonant frequency of an electric signal input from the detection circuit 140 to the resonant circuit or to scan the frequency, and a single detected value at the time may be obtained through a single measurement.

In this case, since it is possible to detect all phenomena in which a conductor comes close to the individual electrode elements within a predetermined distance via the preset detected value ranges for the respective individual locational regions, proximity itself may be detected regardless of whether or not the user comes into contact with the device 100.

Meanwhile, in an embodiment, a detected value varies depending on the degree and/or distance of the proximity of a conductor to the individual electrode elements, so that this may be used to identify how close the conductor is to the individual electrode elements due to the user motion.

Furthermore, a change in capacitance and a change in resonant frequency may vary depending on whether a conductor used by a user is a part of the human body or a material conductor such as a stylus. Accordingly, a single detected value range for each individual locational region is not set for each individual electrode element, but a plurality of detected value ranges may be set for each individual electrode element in accordance with a plurality of conductor types.

According to the related technologies, separate-channel sensors are disposed for respective individual locational regions. These related technologies individually measure changes in capacitance for the respective individual locational regions.

The present invention eliminates the need to measure individual changes in capacitance for respective individual locational regions. In other words, according to the present invention, electrode elements having different sizes and shapes are connected to a single channel, and thus one of the locational regions on the outer side of the device 100 where proximity is recognized is accurately identified through a single measurement.

Furthermore, the present invention has a fast response speed because it may be possible to track a user motion through only a single measurement at every point in time without a frequency scan, and thus the present invention may track a user motion in real time.

Furthermore, the cost of integrated circuits may be reduced because the present invention can cover a wide locational area around the device 100 using the single-channel sensor, and the present invention may be used more effectively even when a mobile device or a battery is used because power can be reduced during the operation of the sensor.

Figure 5:
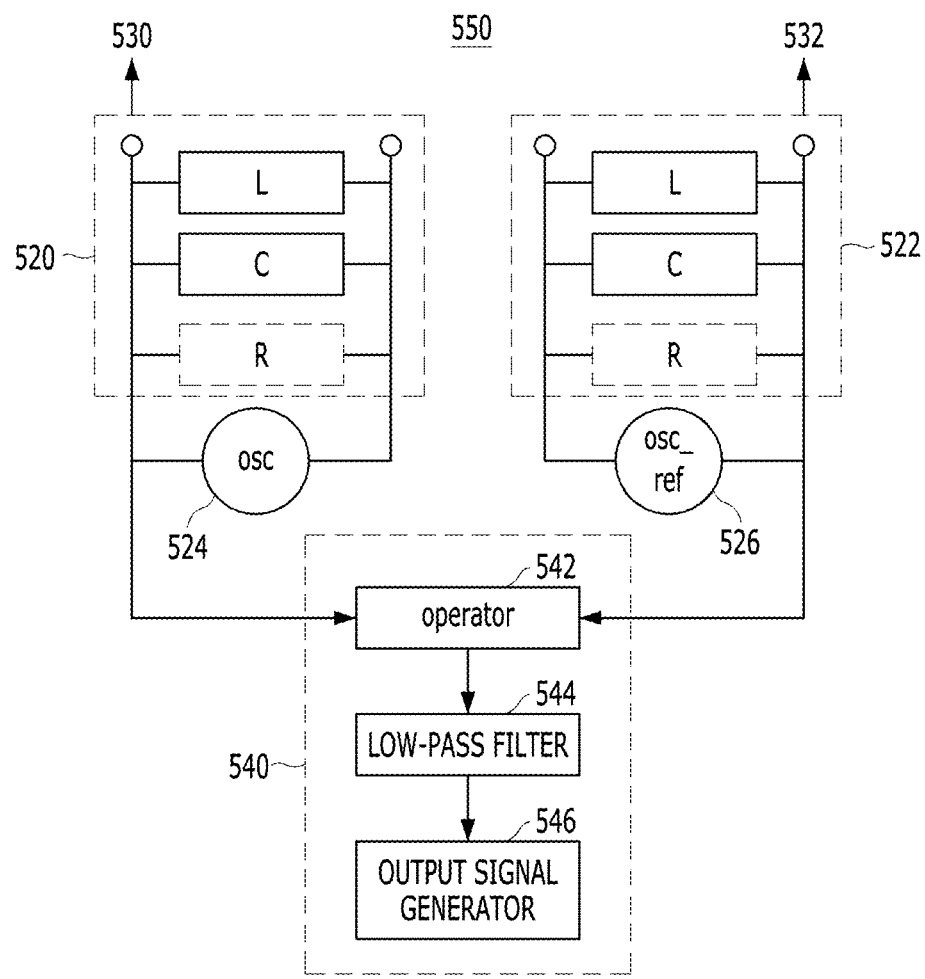
FIG. 5 is a diagram showing the detection circuit of a single-channel multi-region motion sensor according to an embodiment of the present invention.

FIG. 5 is a diagram showing the detection circuit 540 of a single-channel multi-region motion sensor 550 according to an embodiment of the present invention.

Referring to FIG. 5, a first oscillator 524 and a second oscillator 526 are disposed. Although it is recommended that the first oscillator 524 and the second oscillator 526 have the same characteristics, a difference in resonant frequency measured in the absence of a user input may be compensated for by using an offset even when there is a difference in characteristics.

A first resonant circuit 520 is connected to a first electrode 530 and transmits a first electric signal to a detection circuit 540. A second resonant circuit 522 is connected to a second electrode 532 and transmits a second electric signal to the detection circuit 540.

The first resonant circuit 520 and the second resonant circuit 522 shown in FIG. 5 are equivalent circuits, and do not necessarily include a lumped RLC element. For example, capacitance, inductance, and resistance may be independent elements or represent parasitic components. Furthermore, even when the first resonant circuit 520 and the second resonant circuit 522 are implemented using independent elements, the arrangement of the elements does not necessarily follow that of FIG. 5 and it is sufficient if the arrangement of the elements is equivalent to that of the circuit of FIG. 5. In addition, although it is recommended that the first resonant circuit 520 and the second resonant circuit 522 have the same electrical characteristics, a difference in resonant frequency measured in the absence of a user input may be compensated for by using an offset even when there is a difference in electrical characteristics.

When a measured value obtained by eliminating the offset between the first resonant frequency and the second resonant frequency is equal to or larger than a first threshold value, the detection circuit 540 may consider that any one of the first resonant frequency and the second resonant frequency has caused a significant change, and may determine that a conductor attributable to a user motion has come close to any one of the first electrode and the second electrode. In other words, when a change in the difference in resonant frequency is detected due to noise, unintentional movement, unintentional contact, or unintentional vibration, but is smaller than the first threshold value, it may be considered that the first resonant frequency and the second resonant frequency do not cause a significant change.

When a difference between resonant frequency values measured in a state where a user input is not applied is not 0, a calibration process may be performed. For example, the calibration process may be performed based on the addition or adjustment of a variable resistor R' (not shown).

The related technology that is contrasted with the present invention is configured to measure a change in impedance after sequentially inputting a plurality of frequency signals through a variable frequency scan. This method has the prerequisite of accurately detecting and comparing the magnitude of signals. Accordingly, there are problems in that it takes time to measure signals and power consumption is large. In the related technology, when the configuration of the present invention in which a plurality of electrode elements are combined together is applied, signals overlap each other, so that a problem arises in that it is difficult to accurately measure the voltages of electric signals. Accordingly, it is considerably difficult to electrically connect a plurality of electrode elements to a single channel using the conventional variable frequency scan technology and identify an accurate location through a single measurement.

The present invention may sufficiently achieve intended purposes by using changes in resonant frequency as main detection targets instead of using the amplitudes of signals as main detection targets and also employing only a means for applying AC signals of the same frequency without adopting a method such as a variable frequency scan. Accordingly, by using this method, the present invention may rapidly detect and quantify a change in capacitance at a corresponding point in time and even a location where the change occurs.

Furthermore, a change in resonant frequency is not detected in an indirect manner, but the values of frequencies are directly detected, so that it is easy to generate an accurate output signal using the values. An analog signal or digital value proportional to the measured change in resonant frequency may be generated, and thus there is an advantage in that measured information may be accurately transmitted to the controller 160, which is a subsequent step, without loss.

The detection circuit 540 of a single-channel multi-region motion sensor 550 according to an embodiment of the present invention includes an operator 542 configured to calculate a difference between a first resonant frequency $\omega 1$ and a second resonant frequency $\omega 2$, a low-pass filter 544 connected to the output terminal of the calculator 542 and configured to eliminate high-frequency components, and an output signal generator 546 connected to the output terminal of the low-pass filter 544 and configured to generate an electric signal proportional to quantitative information corresponding to the difference between the first resonant frequency $\omega 1$ and the second resonant frequency $\omega 2$.

The operator 542 may generate a differential resonant frequency component signal having a frequency corresponding to a differential resonant frequency $\omega 1$-$\omega 2$, i.e., a difference between the first resonant frequency $\omega 1$ and the second resonant frequency $\omega 2$, by performing signal processing on a first electric signal having the first resonant frequency $\omega 1$ and a second electric signal having the second resonant frequency $\omega 2$. In this case, the operator 542 does not need to directly obtain the first resonant frequency $\omega 1$ or the second resonant frequency $\omega 2$. Since the frequency of the differential resonant frequency component signal obtained by the operator 542 corresponds to the differential resonant frequency $\omega 1$-$\omega 2$ and is a value smaller than the first resonant frequency $\omega 1$ or the second resonant frequency $\omega 2$, a high-performance signal processing circuit is not required to process the differential resonant frequency component signal. The signal processing performed on the first electric signal and the second electric signal to generate the differential resonant frequency component signal may be performed in an analog domain, in a digital domain, or in an analog-digital mixed domain.

Through additional information obtained from the signal processing performed on the first electric signal and the second electric signal to generate the differential resonant frequency component signal, or through the monitoring of the differential resonant frequency component signal over time, information about whether the differential resonant frequency $\omega 1$-$\omega 2$ is a positive number or a negative number, or information about which of the first resonant frequency $\omega 1$ and the second resonant frequency $\omega 2$ is higher may be obtained. Whether the information about which of the first resonant frequency $\omega 1$ and the second resonant frequency $\omega 2$ is higher is correct may be additionally verified through the monitoring of the differential resonant frequency component signal over time.

The electric signal generated by the output signal generator 546 may have a voltage, a current, an amplitude, or a phase proportional to quantitative information corresponding to the difference between the first resonant frequency $\omega 1$ and the second resonant frequency $\omega 2$.

The output signal generator 546 may be a time-to-digital converter configured to generate a digitized value proportional to the frequency of the differential resonant frequency component signal, or an analog voltage generator configured to generate an analog signal proportional to the measured frequency difference. In an embodiment, the output signal generator 546 may be an analog current generator configured to generate a current signal proportional to the measured frequency difference.

According to an embodiment of the detection circuit 540, the detection circuit 540 may include a sampler and a comparator for the differential resonant frequency component signal. In this case, for the smooth operation of the detection circuit 540, the sampler and the comparator may be designed by selecting an operating frequency that is sufficiently greater than the first threshold value and sufficiently greater than the operating range of a resonant frequency component corresponding to a detection target displacement.

In the embodiments of the present invention, the detection circuits 140 and 540 may detect the resonant frequency information of the channel independently of the amplitude of the electric signal of the channel (without detecting the amplitude). In this case, in an embodiment, the related technology of detecting amplitude independently of a resonant frequency may be applied in parallel, and two pieces of detection information (first detected information based on the detection of amplitude, and second detected information based on the detection of resonant frequency independent of amplitude) obtained independently of each other may be cross-verified.

Referring to the embodiments of FIGS. 1 to 5, the detection circuits 140 and 540 may generate detected values over time by detecting the polarities and magnitudes of the values of the difference between the first resonant frequency and the second resonant frequency over time. The detection circuits 140 and 540 may track the movement of the proximity of a conductor or the movement of the location of a touch attributable to a user motion based on values detected over time. The controller 160 may translate the movement of the proximity of the conductor or the movement of the location of the touch attributable to the user motion as a user input intended by the user motion. Meanwhile, in an embodiment, the controller 160 and the detection circuit 140 or 540 are not separated from each other, but may be integrated into one integrated circuit.

Figure 6:
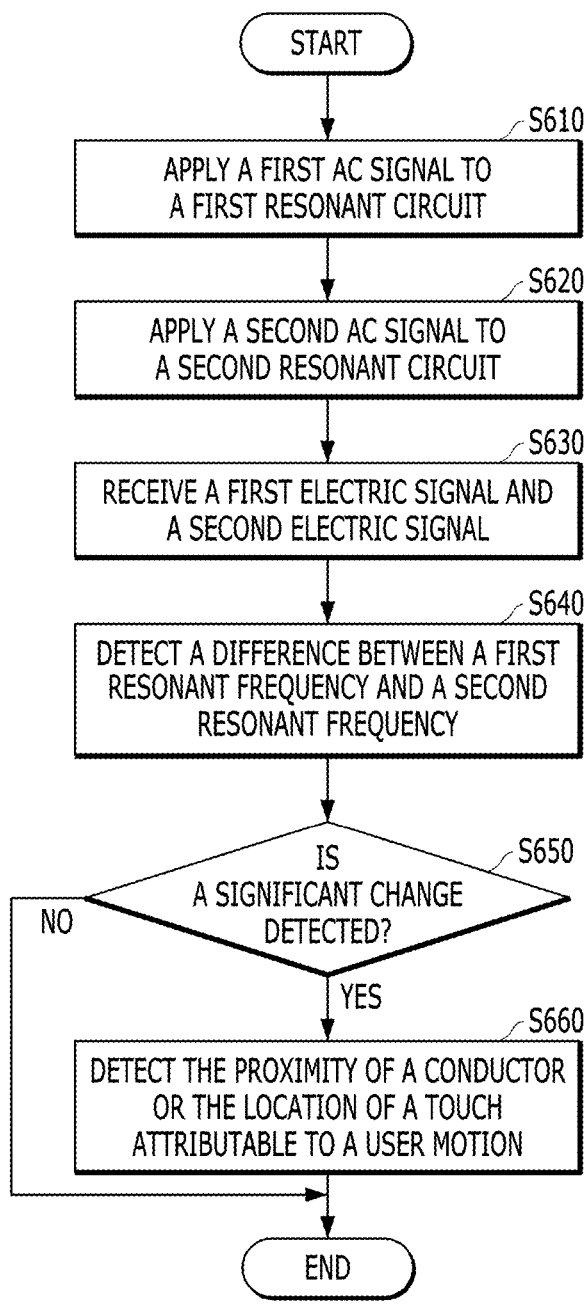
FIG. 6 is an operation flowchart showing a method of operating a single-channel multi-region motion sensor according to an embodiment of the present invention.

FIG. 6 is an operation flowchart showing a method of operating a single-channel multi-region motion sensor according to an embodiment of the present invention.

The method of FIG. 6 may be performed in the embodiments of FIGS. 1 to 5, and may be performed by program instructions loaded and executed by a processor or a controller.

The operation method of FIG. 6 includes: steps S610 and S630 of receiving, by a detection circuit, a first electric signal formed on a first resonant circuit and at least one first electrode electrically connected to the first resonant circuit; steps S620 and S630 of receiving, by the detection circuit, a second electric signal formed on a second resonant circuit and at least one second electrode electrically connected to the second resonant circuit; step S640 of detecting, by the detection circuit, a difference between the first resonant frequency of the first electric signal and the second resonant frequency of the second electric signal; and step S660 of detecting, by the detection circuit, the proximity of a conductor or the location of a touch attributable to a user motion in accordance with the location of the at least one first electrode and the location of the at least one second electrode based on the polarity and magnitude of the value of the difference between the first resonant frequency and the second resonant frequency.

In this case, the detection circuit may perform step S650 of determining whether a significant change is detected by determining whether the result of step S640 exceeds the first threshold value.

The operation method of the present invention may further include the step (not shown) of translating, by the detection circuit or the controller, the movement of the proximity of the conductor or the movement of the location of the touch attributable to the user motion as a user input intended by the user motion. Since a detailed example of the process of interpreting a user motion as a user input can be easily derived by those skilled in the art with reference to the configuration of the related art documents cited above, a detailed description thereof is omitted.

The circuit, the sensor and/or the method of operating a user motion feedback interface device according to the embodiments of the present invention may be implemented in the form of program instructions, and may be then stored in a computer-readable storage medium. The computer-readable storage medium may include program instructions, data files, and data structures solely or in combination. Program instructions recorded on the storage medium may have been specially designed and configured for the present invention, or may be known to or available to those who have ordinary knowledge in the field of computer software. Examples of the computer-readable storage medium include all types of hardware devices specially configured to record and execute program instructions, such as magnetic media, such as a hard disk, a floppy disk, and magnetic tape, optical media, such as compact disk (CD)-read only memory (ROM) and a digital versatile disk (DVD), magneto-optical media, such as a floptical disk, ROM, random access memory (RAM), and flash memory. Examples of the program instructions include machine code, such as code created by a compiler, and high-level language code executable by a computer using an interpreter. These hardware devices may be configured to operate as one or more software modules in order to perform the operation of the present invention, and the vice versa.

However, the present invention is not limited to the embodiments. Like reference symbols in the drawings designate like components. The lengths, heights, sizes, widths, etc. introduced in the embodiments and drawings of the present invention may be exaggerated to help to understand.

According to at least one embodiment of the present invention, it may be possible to detect the location of a user's touch/proximity and track the movement of the location of touch/proximity over time through the single-channel motion sensor configuration. For this reason, according to the present invention, it may be possible to provide a technology capable of accurately detecting a user motion input to the device through the single channel.

According to at least one embodiment of the present invention, it may be possible to identify proximity to each of all the regions around the device using the single-channel sensor, thereby reducing hardware cost.

According to at least one embodiment of the present invention, it may be possible to detect proximity to individual locational regions through a single measurement without a frequency component scan, thereby reducing power consumption and shortening detection time.

According to at least one embodiment of the present invention, it may be possible to detect changes in a time domain and recognize gestures using the single-channel motion sensor.

According to at least one embodiment of the present invention, information detected using the single-channel motion sensor is output as a quantified value, and thus it may be possible to verify whether there is an error in the detection result by comparing it with a predetermined measured value range. It may be verified whether detected touch/proximity location information is attributable to a user's intention or an error.

Since the related technology detects the amplitude of a resonant signal or the amplitude of an analog AC signal, it may be possible to detect only whether a detection result exceeds a predetermined threshold value. In contrast, the present invention may obtain quantified detection information by calculating a difference in the resonant frequency of a differential signal and digitally counting it. Moreover, using this, it may be possible to precisely detect a change in the location of touch/proximity in time and space based on the single-channel sensor.

Although the present invention has been described with reference to specific details such as the specific components, and the limited embodiments and drawings, these are provided merely to help a general understanding of the present invention, and the present invention is not limited thereto. Furthermore, those having ordinary skill in the technical field to which the present invention pertains may make various modifications and variations from the above detailed description.

Therefore, the spirit of the present invention should not be defined based only on the described embodiments, and not only the attached claims but also all equivalent to the claims should be construed as falling within the scope of the spirit of the present invention.

What is claimed is:

1. A single-channel multi-region motion sensor comprising:
   a first resonant circuit;
   at least one first electrode electrically connected to the first resonant circuit;
   a second resonant circuit;
   at least one second electrode electrically connected to the second resonant circuit; and
   a detection circuit configured to receive a first electric signal formed on the first resonant circuit and the at least one first electrode and a second electric signal formed on the second resonant circuit and the at least one second electrode,
   wherein the detection circuit is further configured to detect a difference between a first resonant frequency of the first electric signal and a second resonant frequency of the second electric signal, and to detect proximity of a conductor or a location of a touch attributable to a user motion in accordance with a location of the at least one first electrode and a location of the at least one second electrode based on polarity and magnitude of a value of the difference between the first resonant frequency and the second resonant frequency.

2. The single-channel multi-region motion sensor of claim 1, wherein:
   the at least one first electrode comprises a plurality of first locational region electrode elements all electrically connected to each other; and
   the detection circuit is further configured to detect the proximity of the conductor or the location of the touch attributable to the user motion in accordance with locations of the plurality of first locational region electrode elements based on the polarity and magnitude of the value of the difference between the first resonant frequency and the second resonant frequency.

3. The single-channel multi-region motion sensor of claim 2, wherein:
   the plurality of first locational region electrode elements is disposed to correspond to different first individual locational regions, respectively, around the motion sensor; and
   the plurality of first locational region electrode elements is formed to have different sizes or different shapes.

4. The single-channel multi-region motion sensor of claim 3, wherein:
   the plurality of first locational region electrode elements and the first individual locational regions correspond to respective predetermined different per-individual locational region detected value ranges; and
   the detection circuit is further configured to detect the proximity of the conductor or the location of the touch attributable to the user motion by determining one of the per-individual locational region detected value ranges within which the magnitude of the value of the difference between the first resonant frequency and the second resonant frequency falls.

5. The single-channel multi-region motion sensor of claim 4, wherein the detection circuit is further configured to determine the user motion to be an invalid user motion when the magnitude of the value of the difference between the first resonant frequency and the second resonant frequency is out of the per-individual locational region detected value ranges.

6. The single-channel multi-region motion sensor of claim 1, wherein:
   the detection circuit is further configured to detect polarities and magnitudes of values of the difference between the first resonant frequency and the second resonant frequency over time, and to generate detected values over time; and
   the detection circuit is further configured to track a movement of the proximity of the conductor or a movement of the location of the touch attributable to the user motion based on the detected values over time.

7. The single-channel multi-region motion sensor of claim 1, wherein the detection circuit is further configured to detect the polarity and magnitude of the value of the difference between the first resonant frequency and the second resonant frequency through a single measurement, and to generate detected values.

8. The single-channel multi-region motion sensor of claim 1, wherein the detection circuit comprises:
   an operator configured to calculate a difference between a first resonant frequency and a second resonant frequency;
   a low-pass filter connected to an output terminal of the calculator, and configured to eliminate high-frequency components; and
   an output signal generator connected to an output terminal of the low-pass filter, and configured to generate an electric signal proportional to quantitative information corresponding to the difference between the first resonant frequency and the second resonant frequency.

9. A motion feedback interface device comprising:
   a single-channel multi-region motion sensor; and
   a controller,
   wherein the single-channel multi-region motion sensor comprises:
   a first resonant circuit;
   at least one first electrode electrically connected to the first resonant circuit;
   a second resonant circuit;
   at least one second electrode electrically connected to the second resonant circuit; and
   a detection circuit configured to receive a first electric signal formed on the first resonant circuit and the at least one first electrode and a second electric signal formed on the second resonant circuit and the at least one second electrode,
   wherein the detection circuit is further configured to detect a difference between a first resonant frequency of the first electric signal and a second resonant frequency of the second electric signal, and to detect proximity of a conductor or a location of a touch attributable to a user motion in accordance with a location of the at least one first electrode and a location of the at least one second electrode based on polarity and magnitude of a value of the difference between the first resonant frequency and the second resonant frequency, and wherein the controller determines a user input, intended by the user motion, based on the proximity of the conductor or the location of the touch attributable to the user motion.

10. The motion feedback interface device of claim 9, wherein:
the at least one first electrode comprises a plurality of first locational region electrode elements all electrically connected to each other;
the plurality of first locational region electrode elements is disposed to correspond to different first individual locational regions, respectively, around the motion sensor; and
the detection circuit is further configured to detect the proximity of the conductor or the location of the touch attributable to the user motion in accordance with the first individual locational regions based on the polarity and magnitude of the value of the difference between the first resonant frequency and the second resonant frequency.

11. The motion feedback interface device of claim 9, wherein:
the detection circuit is further configured to detect polarities and magnitudes of values of the difference between the first resonant frequency and the second resonant frequency over time, and to generate detected values over time;
the detection circuit is further configured to track a movement of the proximity of the conductor or a movement of the location of the touch attributable to the user motion based on the detected values over time; and
the controller translates the movement of the proximity of the conductor or the movement of the location of the touch attributable to the user motion as a user input intended by the user motion.

12. A method of operating a single-channel multi-region motion sensor including a detection circuit and a controller, the method comprising:
receiving, by the detection circuit, a first electric signal formed on a first resonant circuit and at least one first electrode electrically connected to the first resonant circuit;
receiving, by the detection circuit, a second electric signal formed on a second resonant circuit and at least one second electrode electrically connected to the second resonant circuit;
detecting, by the detection circuit, a difference between a first resonant frequency of the first electric signal and a second resonant frequency of the second electric signal; and
detecting, by the detection circuit, proximity of a conductor or a location of a touch attributable to a user motion in accordance with a location of the at least one first electrode and a location of the at least one second electrode based on a polarity and magnitude of a value of the difference between the first resonant frequency and the second resonant frequency.

13. The method of claim 12, wherein:
the at least one first electrode comprises a plurality of first locational region electrode elements all electrically connected to each other;
the plurality of first locational region electrode elements is disposed to correspond to different first individual locational regions, respectively, around the motion sensor; and
the detecting proximity of a conductor or a location of a touch comprises detecting, by the detection circuit, the proximity of the conductor or the location of the touch attributable to the user motion in accordance with the first individual locational regions based on the polarity and magnitude of the value of the difference between the first resonant frequency and the second resonant frequency.

14. The method of claim 13, wherein:
the plurality of first locational region electrode elements and the first individual locational regions correspond to respective predetermined different per-individual locational region detected value ranges; and
the detecting proximity of a conductor or a location of a touch comprises detecting, by the detection circuit, the proximity of the conductor or the location of the touch attributable to the user motion by determining one of the per-individual locational region detected value ranges within which the magnitude of the value of the difference between the first resonant frequency and the second resonant frequency falls.

15. The method of claim 12, further comprising:
generating, by the detection circuit, detected values over time by repeating the receiving a first electric signal, the receiving a second electric signal, the detecting a difference between a first resonant frequency of the first electric signal and a second resonant frequency of the second electric signal, and the detecting proximity of a conductor or a location of a touch attributable to a user motion a plurality of times over time; and
tracking, by the detection circuit, a movement of the proximity of the conductor or a movement of the location of the touch attributable to the user motion based on the detected values over time.

16. The method of claim 15, further comprising translating, by the detection circuit or the controller, the movement of the proximity of the conductor or the movement of the location of the touch attributable to the user motion as a user input intended by the user motion.

* * * * *